US 6,551,750 B2

(12) United States Patent
Pierrat

(10) Patent No.: US 6,551,750 B2
(45) Date of Patent: Apr. 22, 2003

(54) SELF-ALIGNED FABRICATION TECHNIQUE FOR TRI-TONE ATTENUATED PHASE-SHIFTING MASKS

(75) Inventor: Christophe Pierrat, Santa Clara, CA (US)

(73) Assignee: Numerical Technologies, Inc., San Jose, CA (US)

( * ) Notice: Subject to any disclaimer, the term of this patent is extended or adjusted under 35 U.S.C. 154(b) by 221 days.

(21) Appl. No.: 09/810,823

(22) Filed: Mar. 16, 2001

(65) Prior Publication Data

US 2002/0132174 A1 Sep. 19, 2002

(51) Int. Cl.$^7$ .............................. G03F 9/00; G06F 17/50
(52) U.S. Cl. .............................................. 430/5; 716/19
(58) Field of Search .................... 430/5, 311, 322; 378/35; 716/19, 21

(56) References Cited

U.S. PATENT DOCUMENTS

| 4,037,918 A | 7/1977 | Kato .......................... 350/3.5 |
| 4,456,371 A | 6/1984 | Lin .............................. 355/71 |
| 4,890,309 A | 12/1989 | Smith et al. ................... 378/35 |
| 4,902,899 A | 2/1990 | Lin et al. .................. 250/492.1 |
| 5,288,569 A | 2/1994 | Lin ............................... 430/5 |
| 5,302,477 A | 4/1994 | Dao et al. ...................... 430/5 |
| 5,308,741 A | 5/1994 | Kemp ......................... 430/312 |
| 5,316,878 A | 5/1994 | Saito et al. ..................... 430/5 |

(List continued on next page.)

FOREIGN PATENT DOCUMENTS

| DE | 195 45 163 A1 | 6/1996 |
| EP | 0 437 376 A2 | 7/1991 |
| EP | 0 464 492 A1 | 1/1992 |
| EP | 0 653 679 A2 | 5/1995 |
| EP | 0 698 821 | 2/1996 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 2650962 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 97/45772 | 12/1997 |
| WO | WO 98/38549 | 9/1998 |
| WO | WO 99/27420 | 6/1999 |
| WO | WO 99/47981 | 9/1999 |

OTHER PUBLICATIONS

Ackmann, P. et al., "Phase Shifting And Optical Proximity Corrections To Improve CD Control On Logic Devices In Manufacturing For Sub 0.35 μm I–Line", Advance Micro Devices (8 pages).

Asai, S. et al., "High Performance Optical Lithography Using A Separated Light Source", *J. Vac. Sci. Technol. B*, vol. 10, No. 6, pp. 3023–3026, Nov./Dec. 1992.

Barouch, E. et al., "OPTIMASK: An OPC Algorithm For Chrome And Phase–Shift Mask Design", *SPIE*, vol. 2440, pp. 192–206, Feb. 1995.

(List continued on next page.)

*Primary Examiner*—Stephen Rosasco
(74) *Attorney, Agent, or Firm*—Bever, Hoffman & Harms, LLP; Jeanette S. Harms

(57) ABSTRACT

A structure and method are provided to ensure self-aligned fabrication of a tri-tone attenuated phase-shifting mask. A sub-resolution, 0 degree phase, greater than 90% transmission rim is provided along the edge of an opaque region. The alignment of this sub-resolution rim with the opaque and attenuated regions of the mask is performed in a single patterning step. In one embodiment, a narrow opaque region can be replaced by a sub-resolution, 0 degree phase, greater than 90% transmission line.

52 Claims, 9 Drawing Sheets

U.S. PATENT DOCUMENTS

| | | | |
|---|---|---|---|
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,847 A | 12/1997 | Tarumoto et al. | 430/5 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,795,682 A | 8/1998 | Garza | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,922,497 A | 7/1999 | Pierrat | 430/5 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,303,253 B1 | 10/2001 | Lu | 430/5 |
| 6,312,854 B1 | 11/2001 | Chen et al. | 430/5 |
| 2002/0076622 A1 | 6/2002 | Pierrat et al. | 430/5 |
| 2002/0132174 A1 | 9/2002 | Pierrat | 430/5 |

OTHER PUBLICATIONS

Brunner, T. et al., "170nm Gates Fabricated By Phase–Shift Mask And Top Anti–Reflector Process", *SPIE*, Optical/Laser Microlithography VI, vol. 1927, pp. 182–189 (1993).

Brunner, T., "Rim Phase–Shift Mask Combined With Off–Axis Illumination: A Path To 0.5λ/Numerical Aperture Geometries", *Optical Engineering*, vol. 32, No. 10, pp. 2337–2343, Oct. 1993.

Fukuda, H. et al., "Determination Of High–Order Lens Aberration Using Phase/Amplitude Linear Algebra", *J. Vac. Sci. Technol. B*, vol. 17, No. 6, pp. 3318–3321, Nov./Dec. 1999.

Fukuda, H., "Node–Connection/Quantum Phase–Shifting Mask: Path To Below 0.3 μm Pitch, Proximity Effect Free, Random Interconnects And Memory Patterning", *J. Vac. Sci. Technol. B*, vol. 17, No. 6, pp. 3291–3295, Nov./Dec. 1999.

Galan, G. et al., "Application Of Alternating–Type Phase Shift Mask To Polysilicon Level For Random Logic Circuits", *Jpn. J. Appl. Phys.*, vol. 33, pp. 6779–6784 (1994).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", *Japanese Journal of Applied Physics*, vol. 30, No. 12B, pp. 3818–3821, Dec. 1991.

Ishiwata, N. et al., "Novel Alternating Phase Shift Mask With Improved Phase Accuracy", *SPIE*, Proceedings of the 17$^{th}$ Annual Symposium on Photomask Technology and Management, vol. 3236, pp. 243–249 (1997).

Jinbo, H. et al., "0.2 μm Or Less i–Line Lithography By Phase–Shifting–Mask Technology", *IEEE*, pp. 33.3.1–33.3.4 (1990).

Jinbo, H. et al., "Application Of Blind Method To Phase–Shifting Lithography", *IEEE*, 1992 Symposium on VLSI Technology Digest of Technical Papers, pp. 112–113 (1992).

Jinbo, H. et al., "Improvement Of Phase–Shifter Edge Line Mask Method", *Japanese Journal of Applied Physics*, vol. 30, No. 11B, pp. 2998–3003, Nov. 1991.

Karklin, L., "A Comprehensive Simulation Study Of The Photomask Defects Printability", *SPIE*, vol. 2621, pp. 490–504 (1995).

Kimura, T. et al., "Subhalf–Micron Gate GaAs Mesfet Process Using Phase–Shifting–Mask Technology", *IEEE*, GaAs IC Symposium, pp. 281–284 (1991).

Levenson, M. et al., "Improving Resolution In Photolithography With A Phase–Shifting Mask", *IEEE Transactions on Electron Devices*, vol. ED–29, No. 12, pp. 1828–1836, Dec. 1982.

Lin, B.J., "Phase–Shifting Masks Gain An Edge", *IEEE Circuits & Devices*, pp. 28–35, Mar. 1993.

Liu, H.Y. et al., "Fabrication of 0.1 μm T–Shaped Gates By Phase–Shifting Optical Lithography", *SPIE*, Optical/Laser Microlithography VI, vol. 1927, pp. 42–52 (1993).

Matsuoka, K. et al., "Application Of Alternating Phase–Shifting Mask To 0.16 μm CMOS Logic Gate Patterns", Matsushita Ind. Co., Ltd. (9 pages).

Mizuno, F. et al., "Practical Phase–Shifting Mask Technology For 0.3 μm Large Scale Integrations", *J. Vac. Sci. Technol. B*, vol. 12, No. 6, pp. 3799–3803, Nov./Dec. 1994.

Morimoto, H. et al., "Next Generation Mask Strategy—Technologies Are Ready For Mass Production Of 256MDRAM?", *SPIE*, vol. 3236, pp. 188–189 (1997).

Neureuther, A., "Modeling Phase Shifting Masks", *SPIE*, 10$^{th}$ Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, vol. 2254, pp. 78–92 (1994).

Nistler, J. et al., "Phase Shift Mask Defect Printability Analysis", Proceedings of the Microlithography Seminar INTERFACE '93, OCG Microelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 31, pp. 4143–4149 (1992).

Pati, Y.C. et al., "Phase–Shifting Masks For Microlithography: Automated Design And Mask Requirements", *J. Opt. Soc. Am.*, vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", *SPIE*, vol. 2194, pp. 298–309 (1994).

Pierrat, C. et al., "Phase–Shifting Mask Topography Effects On Lithographic Image Quality", *IEEE*, pp. 3.3.1–3.3.4 (1992).

Rieger, M. et al., "System For Lithography Proximity Compensation", Precim Company, Portland, Oregon, Sep. 1993 (28 pages).

Roman, B. et al., "Implications Of Device Processing On Photomask CD Requirements", *SPIE*, vol. 3236 (1997) (Abstract Only).

Spence, C. et al., "Automated Determination Of CAD Layout Failures Through Focus: Experiment And Simulation", *SPIE*, vol. 2197, pp. 302–313 (1994).

Spence, C. et al., "Detection Of 60° Phase Defects On Alternating PSMs", Advance Micro Devices, KLA–Tencor, DuPont RTC (2 pages).

Spence, C. et al., "Integration Of Optical Proximity Correction Strategies In Strong Phase Shifters Design For Poly–Gate Layers", *Bacus News*, vol. 15, Issue 12, pp. 1, 4–13, Dec. 1999.

Stirniman, J. et al., "Wafer Proximity Correction And Its Impact On Mask–Making", *Bacus News*, vol. 10, Issue 1, pp. 1, 3–7, 10–12, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", *SPIE*, Optical/Laser Microlithography II, vol. 1088, pp. 25–33, Mar. 1989.

Watanabe, H. et al., "Detection And Printability Of Shifter Defects In Phase–Shifting Masks II Defocus Characteristics", *Jpn. J. Appl. Phys.*, vol. 31, pp. 4155–4160 (1992).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

Ahn, Chang–Nam, et al., "A Study of Optical Proximity Effects Using Off–Axis Illumination with Attenuated Phase Shift Mask", Hyundai Electronics Industries Co., Ltd. (18 pages).

Callegari, A., et al., "Optical Properties of Hydrogenated Amorphous Carbon Film for Attenuated Phase Shift Mask Applications", IBM (12 pages).

Dao, Giang, et al., "248nm DUV MoSiON Embedded Phase–Shifting Mask for 0.25 Micrometer Lithography", Intel Corporation, Ulvac Coating Corporation, Mitsubishi Electric Corporation (14 pages).

Ham, Young–Mog, et al., "Sub–120nm Technology Compatibility of Attenuated Phase Shift Mask in KrF and ArF Lithography", Hyundai Electronics Industries Co., Ltd. (13 pages).

Iwasaki, H., "Fabricating 0.10um Line Patterns Using Attenuated Phase Shift Masks", NEC Corporation (10 pages).

Kagami, I., et al., "Attenuated Phase–Shifting Mask Specification with Modified Beam Illumination", Sony Corporation (12 pages).

Krisa, W.L., et al., "Contact Performance with an Attenuated Phase Shift Reticle and Variable Partial Coherence", Texas Instruments Inc. (8 pages).

Kyoh, S., et al., "Evaluation of Phase and Transmittance Error on Deep UV Halftone Phase Shift Mask", Toshiba Corporation (3 pages).

Ma, Z., et al., "Impact of Illumination Coherence and Polarization on the Imaging of Attenuated Phase Shift Masks", Texas Instruments, KLA Tencor (11 pages).

Martino, R., et al., "Lithographic Evaluation of the Hydrogenated Amorphous Carbon Film", IBM Microelectronics Semiconductor Research and Development (17 pages).

Mikami, K., et al., "Development of the Halftone Phase Shift Mask for DUV Exposure", Dai Nippon Printing Co., Ltd., pp. 76–90.

Miyazaki, J., "Information Concerning Ulcoat MoSiON Phase Shifting Blanks", Mitsubishi Electric Corporation (4 pages).

Samarakone, N., et al., "Comparative Study of I–Line and DUV Lithography for 0.35um and Beyond", Northern Telecom Limited (15 pages).

Socha, R., et al., "Design of 200nm, 170nm, 140nm DUV Contact Sweeper High Transmission Attenuating Phase Shift Mask Through Simulation Part 1", National Semiconductor Corp., Sematech, MicroUnity Systems Engineering, Inc. (37 pages).

Choi, Y., et al., "Optical Proximity Correction on Attenuated Phase Shifting Photo Mask for Dense Contact Array", LG Semicon Company (11 pages).

Kawata, A., et al., "Spray Developer for ZEP7000", Nippon Zeon Co., Ltd, Hoya Corporation (8 pages).

Nakao, S., et al., "0.32um Pitch Random Line Pattern Formation by Dense Dummy Pattern and Double Exposure in KrF Wavelength", Mitsubishi Electric Corporation (10 pages).

Nakao, S., et al., "Innovative Imaging of Ultra–Fine Line Without Using Any Strong RET", Mitsubishi Electric Corporation, pp. 1–12.

Yasuzato, T., et al., "Improvement of Resist Pattern Fidelity with Partial Attenuated Phase Shift Mask", ULSI Device Development Labs, NEC Corporation (12 pages).

Yoshioka, N., et al., "Practical Attenuated Phase–Shifting Mask with a Single–Layer Absorptive Shifter of MoSiO and MoSiON for ULSI Fabrication", ULSI Lab, Mitsubishi Electric Corporation (3 pages).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Pattern Transfer Characteristics of Transparent Phae Shifting Mask", Japanese Journal of Applied Physics, vol. 30, No. 11B, pp. 3004–3009, Nov. 1991.

Lin, B.J., "The Optimum Numerical Aperture for Attenuated Phase–Shifting Masks", Microelectronic Engineering, pp. 79–85, (1992).

Kurihara, M., et al., "Primary Processes in E–Beam and Laser Lithgraphies for Phase–Shift Mask Manufacturing II", SPIE—12th Annual Symposium on Photomask Technology and Management, vol. 1809, pp. 50–61, Sep. 23–24, 1992.

Garofalo, J., et al., "Mask Assisted Off–Axis Illumination Technique for Random Logic", J. Vac. Sci. Technol. B, vol. 11, No. 6, pp. 2651–2658, Nov./Dec. 1993.

Ito, S., et al., "Optimization of Optical Properties for Single–Layer Halftone Masks", SPIE, vol. 2197, pp. 99–110 (1994).

Miyashita, II., et al., "Manufacturing of Half–Tone Phase Shift Masks II. Writing and Process", SPIE, vol. 2254, pp. 248–260, Apr. 22, 1994.

Mohri, H., et al., "Chromium–Based Attenuated Phase Shifter for DUV Exposure", SPIE, vol. 2322, pp. 288–298, Sep. 14–16, 1994.

Mohri, H., et al., "Manufacturing of Half–Tone Phase Shift Masks I. Blank", SPIE, vol. 2254, pp. 238–247, Apr. 22, 1994.

Yokoyama, T., et al., "Manufacturing of Half–Tone Phase Shift Masks III. Inspection, Repair and Quality Assurance", SPIE, vol. 2254, pp. 261–274, Apr. 22, 1994.

Rothschild, M., et al., "Lithography at a Wavelength of 193nm", IBM J. Res. Develop., vol. 41, No. 1/2, pp. 49–55, Jan./Mar. 1997.

Wong, A., et al., "Deep–UV Lithographic Approaches for 1Gb DRAM", 1997 Symposium on VLSI Technology Digest of Technical Papers, pp. 127–128 (1997).

Chen, J. Fung, et al., "High–T, Ternary Attenuating PSMs for the 130nm Node", Microlithography World, pp. 12, 14, 16, 18, 20 & 30 (2000).

Lin, B.J., et al., "Single–Level Electric Testsites for Phase–Shifting Masks", SPIE, vol. 1673, pp. 221–228, Mar. 9–11, 1992.

Schmidt, R., et al., "Process Latitude and CD Bias Evaluation of Attenuated PSM", SPIE, vol. 3051, pp. 257–265, Mar. 12–14, 1997.

Schmidt, R., et al., "Impact of Coma on CD Control for Multiphase PSM Designs", AMD, ASML (11 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on––Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ronse, K., et al., "Comparison of Various Phase Shift Strategies and Application to 0.35um ASIC Designs", SPIE—Optical/Laser Microlithograpy VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Mask-making and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

SELF-ALIGNED FABRICATION TECHNIQUE FOR TRI-TONE ATTENUATED PHASE-SHIFTING MASKS

BACKGROUND OF THE INVENTION

1. Field of the Invention

The present invention relates to a tri-tone attenuated phase-shifting mask, and in particular to a self-aligned fabrication technique for a tri-tone attenuated phase-shifting mask.

2. Description of the Related Art

Lithography is a well-known process used in the semiconductor industry to form lines, contacts, and other known structures in integrated circuits (ICs). In conventional lithography, a mask (or a reticle) having a pattern of transparent and opaque regions representing such structures in one IC layer is illuminated. The emanating light from the mask is then focused on a resist layer provided on a wafer. During a subsequent development process, portions of the resist layer are removed, wherein the portions are defined by the pattern. In this manner, the pattern of the mask is transferred to or printed on the resist layer.

However, diffraction effects at the transition of the transparent regions to the opaque regions can render these edges indistinct, thereby adversely affecting the resolution of the lithographic process. Various techniques have been proposed to improve the resolution. One such technique, phase-shifting, uses phase destructive interference of the waves of incident light. Specifically, phase-shifting shifts the phase of a first region of incident light waves approximately 180 degrees relative to a second, adjacent region of incident light waves. Therefore, the projected images from these two regions destructively interfere where their edges overlap, thereby creating a clear separation between the two images. Thus, the boundary between exposed and unexposed portions of a resist illuminated through a semiconductor mask (or reticle) can be more closely defined by using phase-shifting, thereby allowing greater structure density on the IC.

FIG. 1A illustrates a simplified, phase-shifting mask 100 fabricated with an attenuated, phase-shifting region 102 formed on a clear region 101, wherein a border 110 of attenuated, phase-shifting region 102 defines a single IC structure. Clear region 101 is transparent, i.e. a region having an optical intensity transmission coefficient T>0.9. In contrast, attenuated phase-shifting region 102 is a partially transparent region, i.e. a region having a low optical intensity transmission coefficient 0.03<T<0.1. Referring to FIG. 1B, which shows a cross-section of mask 100, the phase shift of light passing through attenuated phase-shifting region 102 relative to light passing through clear region 101 is approximately 180 degrees.

As known by those skilled in the art, increasing the intensity transmission coefficient of attenuated phase-shifting region 102 could increase the performance of structures formed by the photolithographic process. In fact, optimal performance would be theoretically achieved by providing an attenuated, phase-shifting region with an optical intensity transmission coefficient T>0.9 (in other words, the region is transparent) yet having a phase shift of 180 degrees relative to clear region 101. In this manner, assuming partially coherent illumination, amplitude side lobes from each region would substantially cancel, thereby creating a substantially zero-intensity line at the transition between these two regions. Current material technology typically provides this phase shift with an attenuated, phase-shifting region having an optical intensity transmission coefficient of approximately T=0.4, although providing a higher transmission is theoretically possible.

Unfortunately, the use of this higher transmission phase-shifting material increases the risk of printing certain portions of attenuated phase-shifting region 102. Specifically, to ensure complete removal of residual resist, the actual dose used to remove the resist is typically at least twice the theoretical dose needed to remove the resist. This overexposure can result in increasing the risk of printing certain larger portions of attenuated phase-shifting region 102.

To solve this problem, some masks, called tri-tone attenuated phase-shifting masks, include an opaque region within the larger portion(s) of the attenuated, phase-shifting region, wherein the opaque region blocks any unwanted light transmitted by the attenuated phase-shifting region. FIG. 2A illustrates a simplified, phase-shifting mask 200 fabricated with an attenuated phase-shifting region 202 formed on a clear region 201 and an opaque region 203 formed on attenuated phase-shifting region 202, wherein a border 210 of attenuated phase-shifting region 202 defines a single IC structure. In this embodiment, clear region 201 has an optical intensity transmission coefficient T>0.9, attenuated phase-shifting region 202 has an optical intensity transmission coefficient 0.03<T<0.4, and an opaque region 203 typically has an intensity transmission coefficient of T<0.01. Referring to FIG. 2B, which shows a cross-section of mask 200, the phase shift of light passing through attenuated phase-shifting region 202 relative to light passing through clear region 201 remains approximately 180 degrees. Thus, forming an opaque region on an attenuated phase-shifting region advantageously allows for the use of a significantly higher optical intensity transmission coefficient.

FIGS. 3A–3G illustrate a conventional process for generating a tri-tone attenuated phase-shifting mask. FIG. 3A illustrates a conventional PSM blank 300 including a transparent substrate 301 on which are formed an attenuated phase-shifting layer (hereinafter attenuated layer) 302 and an opaque layer 303. Blank 300 further includes a first resist, i.e. e-beam or photo sensitive, layer 304 formed on opaque layer 303.

During a primary patterning operation, an e-beam scanner or a UV exposure tool (hereinafter, the patterning tool) can expose areas 305A and 305B of first resist layer 304. After areas 305A and 305B are developed, patterned resist region 304A is formed, as shown in FIG. 3B. In this embodiment, an etch process is then performed to transfer the pattern in first resist region 304A to opaque layer 303. FIG. 3C shows the resulting patterned opaque region 303A. At this point, any exposed upper surface of attenuated layer 302 and the upper surface of first resist region 304A are subjected to a standard dry or wet etch, thereby removing all portions of attenuated layer 302 not protected by first resist region 304A and patterned opaque region 303A. First resist region 304A is then stripped away, leaving the structure shown in FIG. 3D.

Next, the structure is coated with a second resist layer 306 as shown in FIG. 3E. A secondary patterning operation in then performed in which the patterning tool exposes areas 307A and 307B of second resist layer 306. After areas 307A and 307B are developed, a patterned second resist region 306A is formed, as shown in FIG. 3F. In this embodiment, an etch process is then performed (not shown) to transfer the pattern of second resist region 306A to patterned opaque region 303A. Second resist region 306A is then stripped away, leaving the resulting twice-patterned opaque region 303A(1), as shown in FIG. 3G. At this point, the pattern necessary for the tri-tone attenuated phase-shifting mask has been completed.

However, as noted in FIG. 3E, patterned opaque region 303A is not self-aligned to patterned attenuated region 302 during the manufacturing process. Thus, the distance D1 from the edge of twice-patterned opaque region 303A(1) to the edge of patterned attenuated region 302A on one side of the structure may not equal distance D2 on the other side of the structure. Unfortunately, any misalignment of twice-patterned opaque region 303A(1) with patterned attenuated region 302A can generate critical dimension and pattern placement errors, thereby degrading performance of the resulting structures on the IC. Moreover, in an extreme case, if either one of distances D1 and D2 is too large, then printing of a portion of patterned attenuated region 302A may occur.

Therefore, a need arises for a structure and a method of providing self-alignment for a tri-tone, attenuated phase-shifting mask.

SUMMARY OF THE PRESENT INVENTION

In accordance with the present invention, a self-aligned photolithographic mask comprises a plurality of structures, wherein a subset of the structures include an opaque region, an attenuated region, and a sub-resolution transparent rim between the opaque region and the attenuated region. In one embodiment, the plurality of structures are formed on a transparent layer and the transparent rim is formed with the transparent layer.

Typically, the transparent rim has a 0 degree phase and an optical intensity transmission coefficient greater than 0.9, whereas the attenuated region has approximately a 180 degree phase and an optical intensity transmission coefficient between approximately 0.03 and approximately 1.0. The opaque region generally has an optical intensity transmission coefficient of less than approximately 0.01.

In one embodiment, at least one of the subset of structures includes an attenuated portion comprising a sub-resolution line without an adjacent opaque region.

In accordance with one feature of the present invention, a method of forming a plurality of structures in an attenuated phase-shifting mask is provided. A subset of the structures are formed by a first region and a second region, wherein the first region has a phase shift relative to the second region of 180 degrees. In the invention, the method comprises providing a third region within a boundary for the second region, and providing a sub-resolution rim within the boundary of the second region and adjacent a boundary for the third region. The first, second, and third regions can include a transparent region, an attenuated region, and an opaque region, respectively. Advantageously, the opaque region and the sub-resolution rim can be aligned at the same time. In one embodiment, this alignment is performed by a UV patterning tool.

In accordance with another feature of the present invention, a method of fabricating an attenuated phase-shifting mask is provided. The method comprises providing an attenuated layer on a transparent layer, wherein a phase shift of the attenuated layer relative to the transparent layer is approximately 180 degrees. An opaque layer is provided on the attenuated layer. A first resist layer provided on the opaque layer is patterned to provide an alignment for an attenuated region, an opaque region, and a sub-resolution rim.

The opaque layer is etched to form the opaque region. Then, the attenuated layer is etched to form the attenuated region. The patterned first resist layer is removed. In an alternate embodiment, the patterned first resist layer is removed immediately after etching the opaque layer, wherein the patterned opaque layer is then used as a mask to etch the attenuated layer. This alternate embodiment allows the mask to be cleaned, inspected, and repaired before patterning the attenuated layer, thereby improving the pattern quality.

At this point, a second resist layer is provided that covers the opaque region and exposes the attenuated region. Any opaque portions that are not covered by the second resist layer, i.e. any remaining opaque portions in the attenuated region, are removed. Finally, the second resist layer is removed.

In accordance with another feature of the invention, computer software is provided for forming an attenuated phase-shifting mask from a blank. The blank includes a transparent layer, an attenuated layer, and an opaque layer. The attenuated phase-shifting mask includes a plurality of structures, wherein a subset of the structures each include an attenuated region, an opaque region formed within the attenuated region, and a transparent rim formed adjacent the opaque region. To eliminate potential misalignment, the software includes means for aligning the attenuated region, the opaque region, and the transparent rim simultaneously. In the present invention, the software can further include means for etching the opaque layer to form the opaque region, means for etching the attenuated layer to form the attenuated region, means for protecting the opaque region and exposing the attenuated region, and means for removing any remaining opaque portions in the attenuated region.

In yet another feature of the invention, computer software is provided for converting an integrated circuit layout into an attenuated phase-shifting mask layout for fabricating the integrated circuit. The software comprises means for identifying a subset of structures in the integrated circuit layout and means for converting the subset of structures into the mask layout. A converted structure can include a transparent region, an attenuated region formed within the transparent region, an opaque region formed within the attenuated region, and a sub-resolution transparent rim formed adjacent the opaque region. Another converted structure can include a transparent region, an attenuated region formed within the transparent region, and a sub-resolution line formed within the attenuated region. The computer software can include means for aligning the attenuated region, the opaque region, and the sub-resolution transparent rim simultaneously, thereby eliminating the potential for misalignment.

In accordance with another feature, a method of fabricating an integrated circuit is provided. The method comprises radiating a plurality of photolithographic masks. At least one mask includes a plurality of structures, wherein some of the structures include an opaque region, an attenuated region, and a sub-resolution transparent rim between the opaque region and the attenuated region. In this fabrication method, emanating radiation from this mask is focused onto a resist layer provided on a wafer. The resist layer is then developed to form the integrated circuit. In a typical embodiment, the attenuated region provides a 180 degree phase shift and an optical intensity transmission of between 3 and 100%, whereas the sub-resolution transparent rim provides a 0 degree phase shift and an optical intensity transmission greater than 90%.

In accordance with yet another feature of the present invention, a method of converting a binary mask layout into a tri-tone, attenuating mask layout includes dividing up a structure on the binary mask layout into one or more polygons. If the width of a polygon is smaller than a first width W1, then the polygon is replaced with a first structure including only an attenuated portion. If the width of the polygon is between the first width W1 and a second width W2, then the polygon is replaced with a second structure including a sub-resolution line formed in the middle of an attenuated portion. Finally, if the width of the polygon is larger than the second width W2, then the polygon is replaced with a third structure including an opaque portion surrounded by a sub-resolution rim, which in turn is surrounded by an attenuated portion.

DETAILED DESCRIPTION OF THE DRAWINGS

The present invention provides a self-aligned fabrication technique for a tri-tone attenuated phase-shifting mask. In the present invention, a sub-resolution, 0 degree phase rim having greater than approximately 90% transmission is provided along the edge of an opaque region of the mask. Moreover, in one embodiment, a narrow opaque region can be replaced by a sub-resolution, 0 degree phase, greater than approximately 90% transmission region. In this manner, the opaque to attenuated edge of the prior art, which could easily be misaligned, is eliminated. In one feature of the invention, and described in detail below, the alignment of the sub-resolution rim with the opaque and attenuated regions of the mask is advantageously performed in a single patterning step.

Figure 4A:
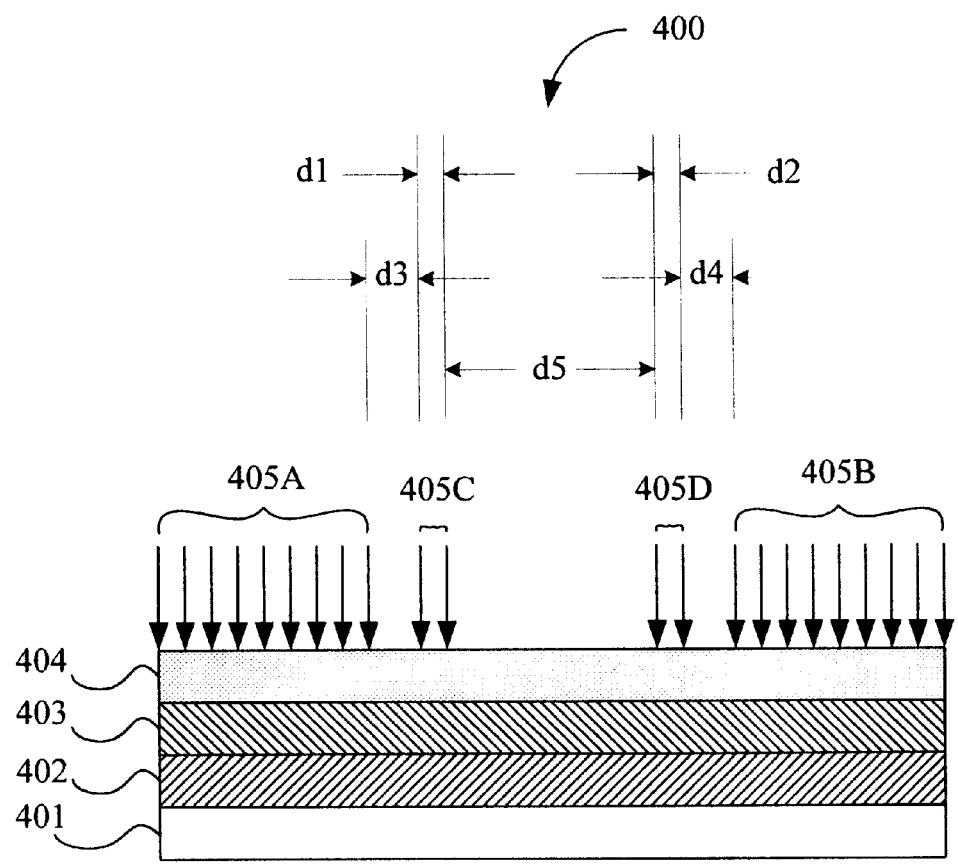
FIGS. 4A–4G illustrate a process for generating a self-aligned tri-tone attenuated phase-shifting mask in accordance with the present invention.

FIGS. 4A–4G illustrate a process for generating a self-aligned tri-tone attenuated phase-shifting mask in accordance with the present invention. FIG. 4A illustrates a conventional PSM blank 400 including a transparent substrate 401 on which are formed an attenuated phase-shifting (hereinafter "attenuated") layer 402 and an opaque layer 403. In one embodiment, transparent substrate 401 can be formed of fused silica or borosilicate glass (used for wavelengths above 365 nanometers because of absorption at lower wavelengths), attenuated layer 402 can be formed of molybdenum silicide having a thickness between approximately 50 to 200 nanometers, and opaque layer 403 can be formed of chromium having a thickness between approximately 50 to 200 nanometers. In other embodiments, attenuated layer 402 can be formed from silicon nitride, aluminum oxide, molybdenum silicide, chrome oxy-nitride, chrome oxy-fluoride, and zirconium silicide. Blank 400 further includes a first resist (i.e. sensitive to electron beam or UV) layer 404 formed on opaque layer 403. In one embodiment, transparent layer 401 can have an optical intensity transmission coefficient T≈1 (i.e greater than approximately 90% transmission) and a 0 degree phase, attenuated layer 402 can have an optical intensity transmission coefficient $0.03 \leq T \leq 1.0$ (3–100% transmission) and a 180 degree phase, and opaque layer 403 can have an intensity transmission coefficient of $T \leq 0.01$ (effectively, 0% transmission).

During a primary patterning operation, an electron beam scanner or a UV exposure tool (hereinafter, the patterning tool) exposes areas 405A, 405B, 405C, and 405D of first resist layer 404. This single step advantageously defines the alignment of the sub-resolution rim to the opaque and attenuated regions of the structure. Specifically, distances d1 and d2 of areas 405C and 405D, respectively, define the widths of the sub-resolution rim; distance d5 between areas 405C and 405D defines the width of the opaque region; distance d3 between areas 405A and 405C defines the width of a portion of an attenuated region; and distance d4 between areas 405B and 405D defines the width of another portion of the same attenuated region. In a typical embodiment, distances d1 and d3 are substantially the same as distances d2 and d4, respectively.

Figure 4B:
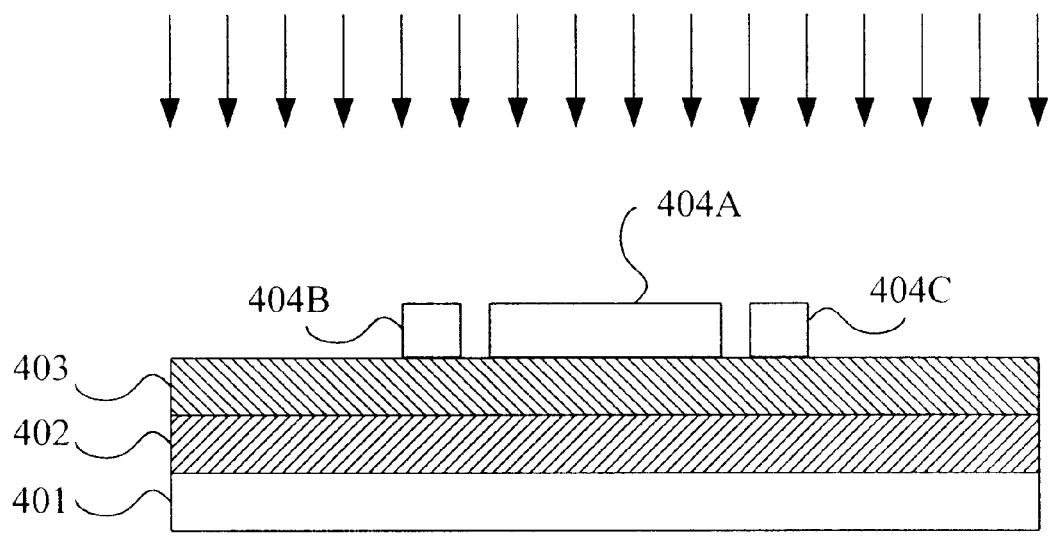
Figure 4C:
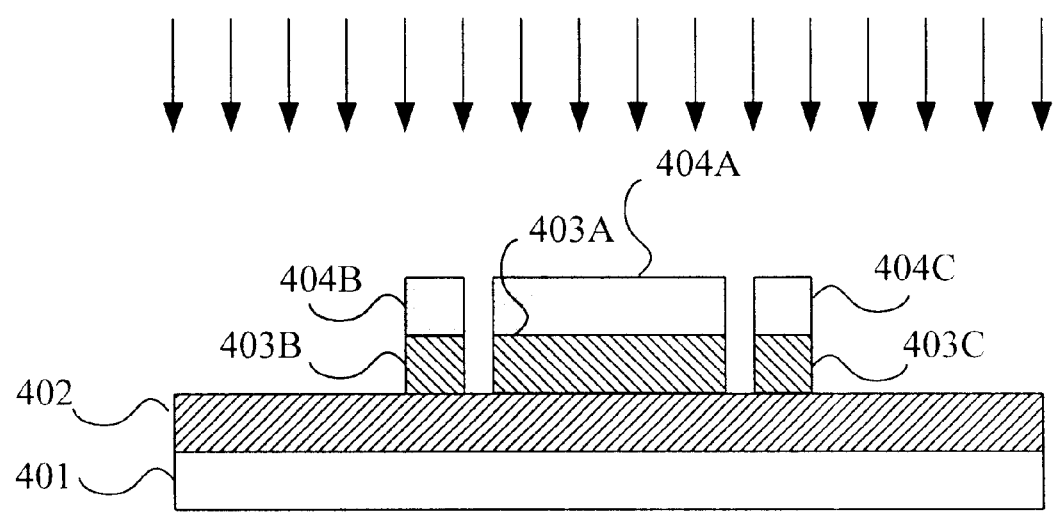
Figure 4D:
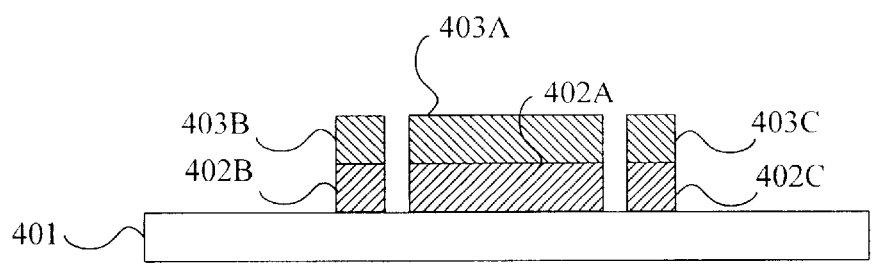

After areas 405A, 405B, 405C, and 405D are developed, patterned first resist regions 404A, 404B, and 404C are formed, as shown in FIG. 4B. In this embodiment, an etch process is then performed to transfer the pattern of first resist regions 404A, 404B, and 404C to opaque layer 403. FIG. 4C shows the resulting patterned opaque regions 403A, 403B, and 403C. At this point, the structure is subjected to a standard dry or wet etch, thereby removing all portions of attenuated layer 402 not protected by first resist regions 404A, 404B, and 404C and patterned opaque regions 403A, 403B, and 403C. First resist regions 404A, 404B, and 404C are then stripped away, thereby leaving the structure shown in FIG. 4D.

In an alternate embodiment, patterned first resist regions 404A, 404B, and 404C are removed immediately after etching opaque layer (see FIG. 4C), wherein the patterned opaque portions 403A, 403B, and 403C are then used as a mask to etch attenuated layer 402. This alternate embodiment allows the mask to be cleaned, inspected, and repaired before patterning attenuated layer 402, thereby improving the pattern quality. However, this benefit could be counter-balanced by the additional time of performing the cleaning, inspecting, and repairing steps.

Figure 4E:
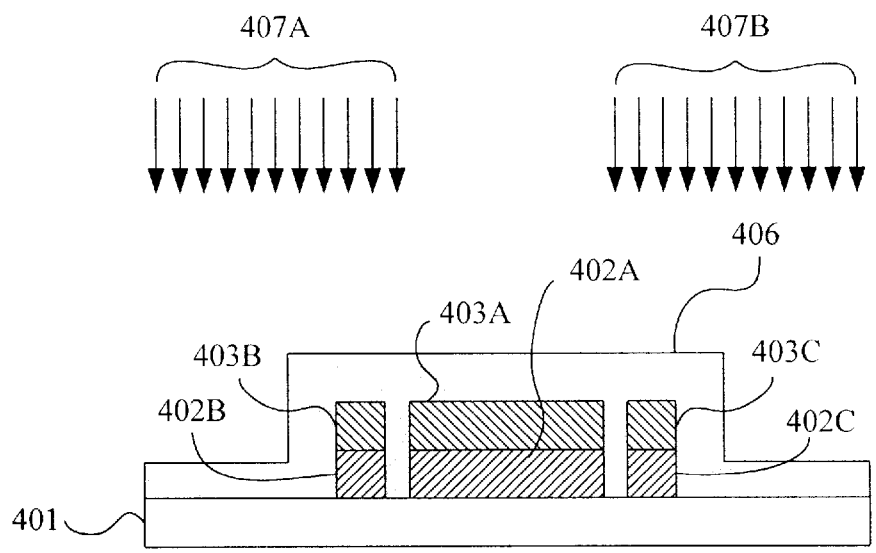

Next, the structure is coated with a second resist layer 406 as shown in FIG. 4E. A secondary patterning operation in then performed in which a patterning tool exposes areas 407A and 407B of second resist layer 406.

Of importance, areas 407A and 407B are sized to fully expose patterned opaque regions 403B and 403C (and thus also patterned attenuated regions 402B and 402C), but to protect patterned opaque region 403A (and thus also patterned attenuated region 402A). Note that this exposure can be a multi-step process with increasing levels of accuracy. For example, areas 407A and 407B can be sized initially to merely expose part of patterned opaque regions 403B and 403C and then be more accurately sized in a second exposure based on the exposed portions of patterned opaque regions 403B and 403C (wherein the total width of each patterned opaque region 403B and 403C is known, as indicated in reference to FIG. 4A). In this manner, the present invention ensures that patterned opaque region 403A and patterned attenuated region 402A are protected.

Figure 4F:
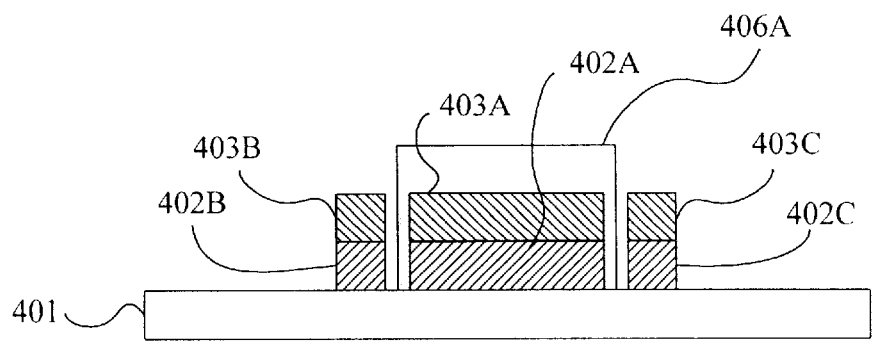
Figure 4G:
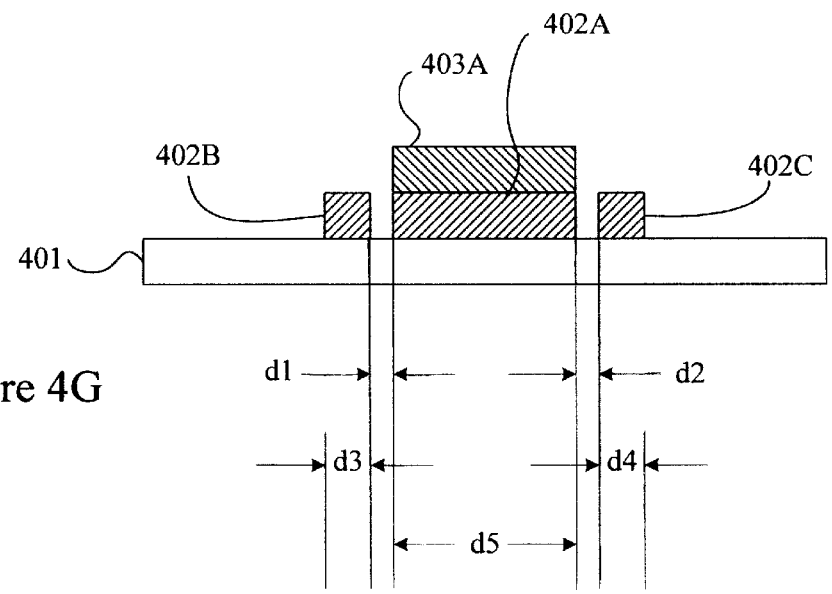
Figure 5A:
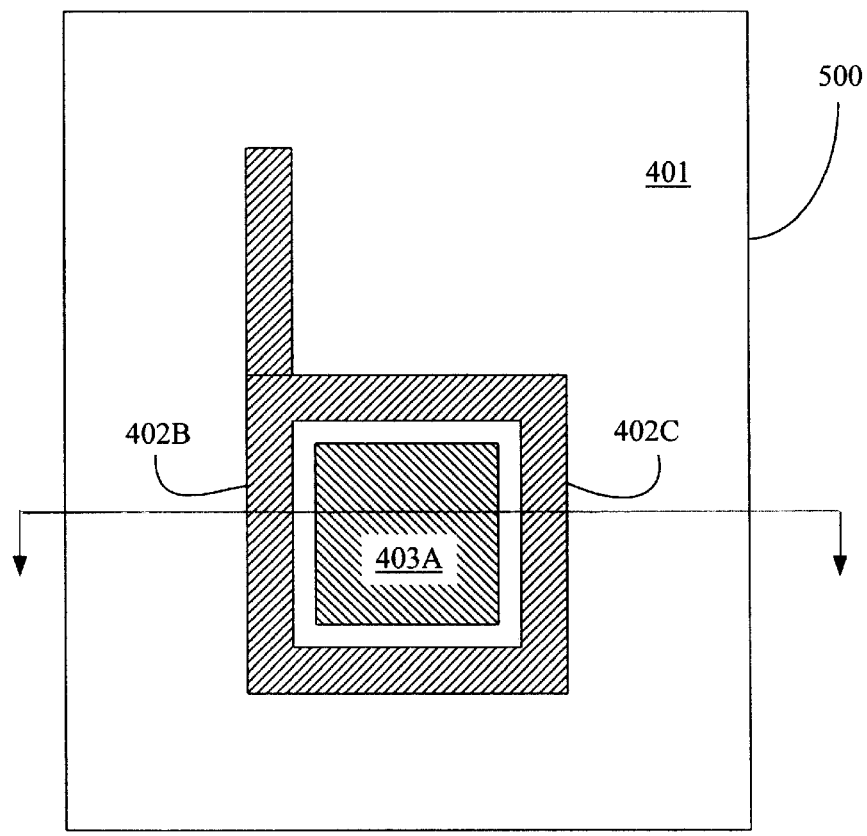
FIG. 5A illustrates one layout of a structure having the cross-section shown in FIG. 4G.

After areas 407A and 407B are developed, patterned second resist region 406A is formed, as shown in FIG. 4F. Of importance, patterned second resist region 406A completely covers the opaque region (see distance d5 in FIG. 4A) while exposing the attenuated regions (see distances d3 and d4, also in FIG. 4A). Note that this step could include multiple developments to expose the portions of the attenuated regions furthest from the opaque region first and stopping when the attenuated regions are completely exposed without exposing the opaque region. In this embodiment, an etch process is then performed (not shown) to remove patterned opaque regions 403B and 403C. Second resist region 306A is then stripped away, leaving patterned opaque layer 403A, as shown in FIG. 4G. At this point, the desired pattern for the tri-tone attenuated phase-shifting mask of the present invention has been completed. FIG. 5A illustrates one layout 500 of a structure having the cross-section shown in FIG. 4G.

As mentioned previously in reference to FIG. 4A, distance d1 between patterned attenuated region 402B and patterned opaque region 403A (and thus also patterned attenuated region 402A) is substantially the same as distance d2 between patterned attenuated region 402C and patterned opaque region 403A (and thus also patterned attenuated region 402A). Of importance, both d1 and d2 are sub-resolution, i.e. the spacing is small enough relative to the stepper settings that these "rims" will not print when the mask is exposed. In one embodiment, distances d1 and d2 (i.e. the widths of the sub-resolution rim) and distances d3 and d4 (i.e. the width of the attenuated regions) are each calculated by using the following equation.

$$D = k \cdot \lambda / NA$$

wherein $\lambda$ is the wavelength of the exposing radiation, NA is the numerical aperture, and k is a constant based on the illumination conditions (i.e. partial coherence and on/off axis illumination) as well as the resist used. Note that the constant k for distances d1 and d2 (associated with the sub-resolution rim) and for distances d3 and d4 (associated with the attenuated regions) are different. Thus, $$d1 = d2 = k1 \cdot \lambda / NA$$

$$d3 = d4 = k2 \cdot \lambda / NA$$

Ideally, distances d1 and d2 should be smaller than distances d3 and d4. Specifically, d1 and d2 should be as small as possible without comprising the self-alignment process of the present invention. Additionally, in light of current mask manufacturing capability, fabricating, inspecting, and repairing features that are smaller than 0.3 to 0.4 microns on the mask (translating into 75 to 100 nanometers on the wafer, assuming a 4× stepper or scanner) can be difficult. Therefore, these and other limitations can determine how small d1 and d2 can be.

In contrast, distances d3 and d4 should be as large as possible to optimize performance from the mask. However, the larger d3 and d4 are, the greater the probability of side-lobe printing. Therefore, this limitation can determine how large d3 and d4 can be.

To determine the values of k, simulations can be performed to get a range of possible feature sizes for d1–d4. Then, a test mask using these feature sizes can be used to process one or more wafers. The values of k can be derived from the wafer(s) taking into account the following criteria: mask realignment performance, mask process resolution, wafer performance (i.e. overall process latitude, dose, and focus latitude), and side-lobe printing on the wafer.

In one embodiment in which the wavelength $\lambda$ is 248 nanometers, the partial coherence of the illumination system $\sigma = 0.3$, the numerical aperture NA is 0.6, and the minimum feature size is 100 nanometers, the present invention can provide an attenuated region width (d3 or d4) of 100 nanometers and a sub-resolution rim width (d1 or d2) of 100 nanometers. Thus, k1 and k2 can be, but are not necessarily, equal.

Figure 1A:
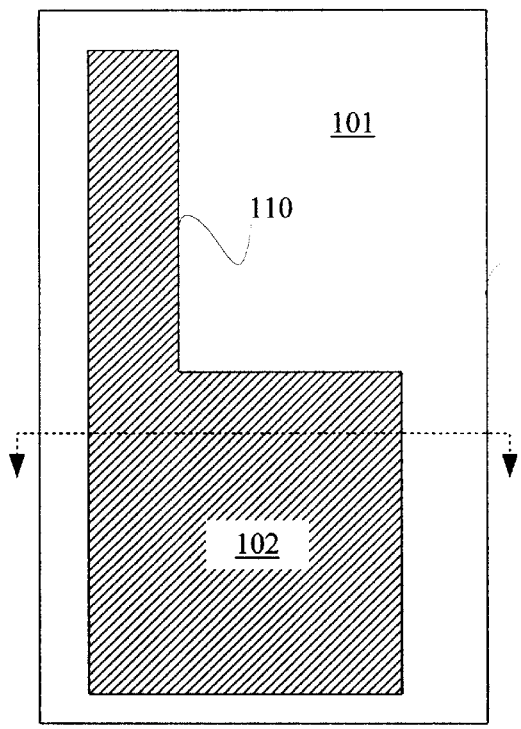
FIG. 1A illustrates a simplified, phase-shifting mask fabricated with an attenuated phase-shifting region formed on a clear region, wherein the border of the attenuated phase-shifting region defines a single IC structure.
Figure 1B:
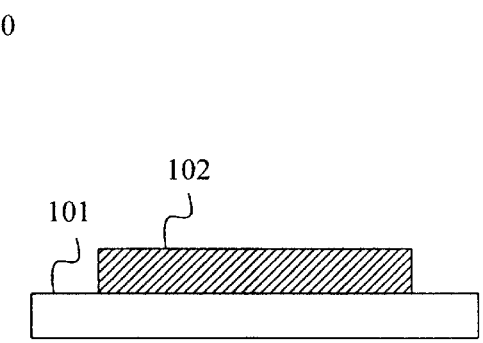
FIG. 1B illustrates a cross-section of the phase-shifting mask of FIG. 1A.
Figure 2A:
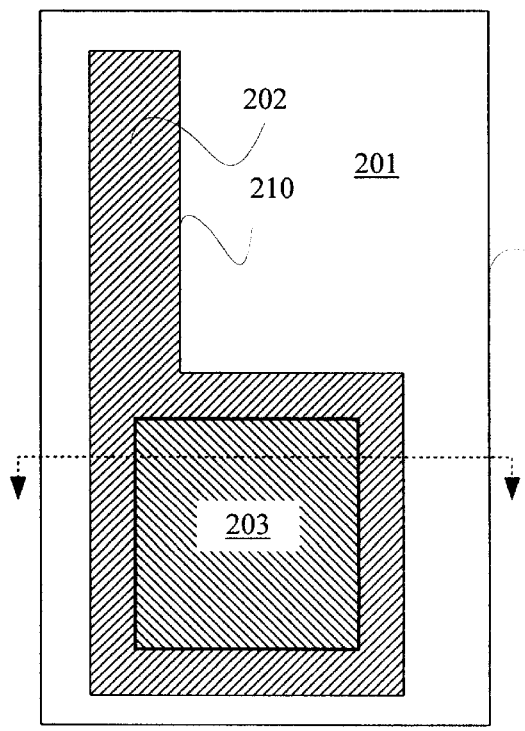
FIG. 2A illustrates a simplified, tri-tone attenuated phase-shifting mask fabricated with an attenuated phase-shifting region formed on a clear region and an opaque region formed on the attenuated phase-shifting region, wherein the border of the attenuated phase-shifting region defines a single IC structure.
Figure 2B:
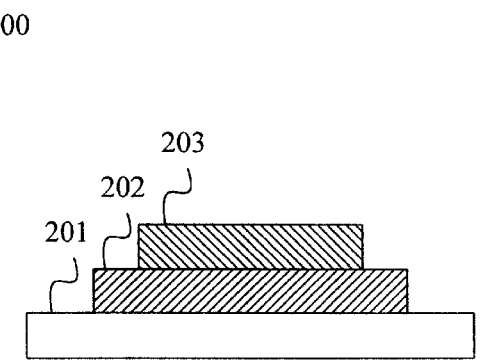
FIG. 2B illustrates a cross-section of the tri-tone attenuated phase-shifting mask of FIG. 2A.
Figure 3A:
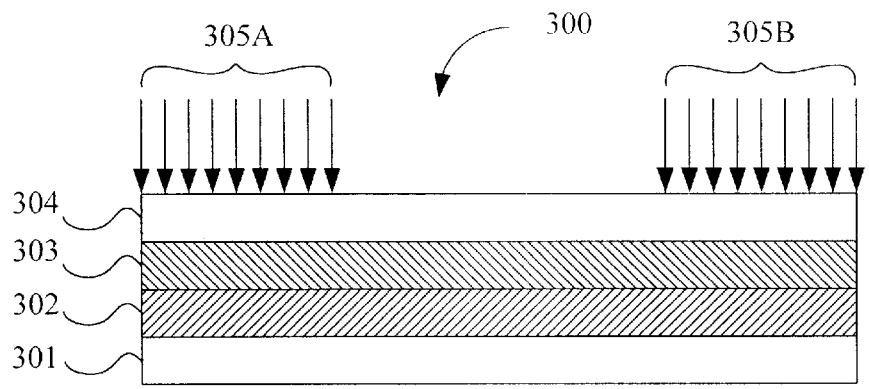
FIGS. 3A–3G illustrate a conventional process for generating a tri-tone attenuated phase-shifting mask.
Figure 3B:
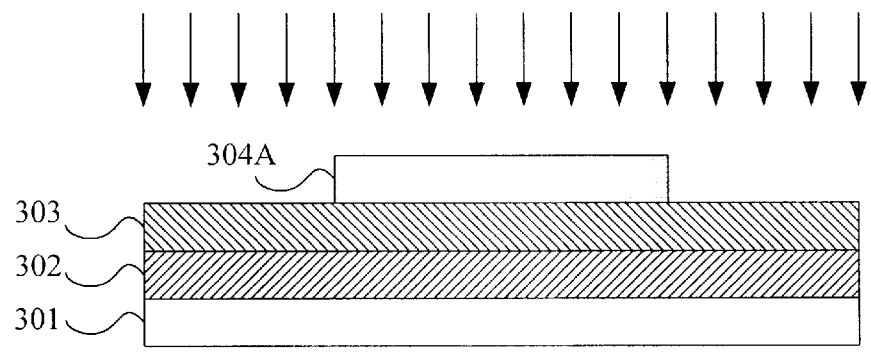
Figure 3C:
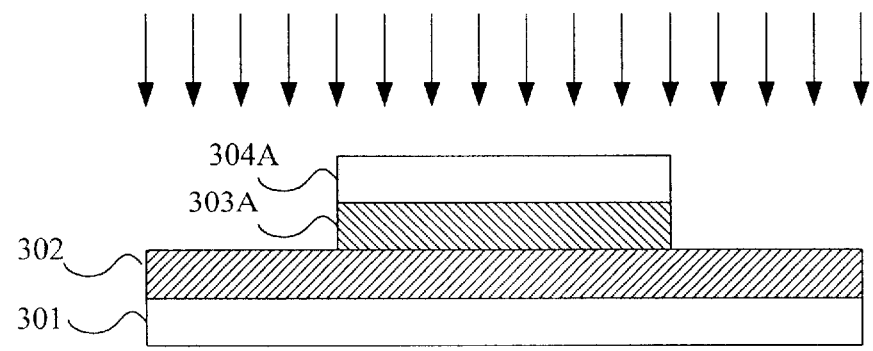
Figure 3D:
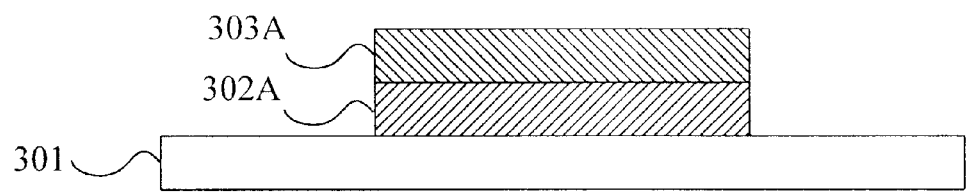
Figure 3E:
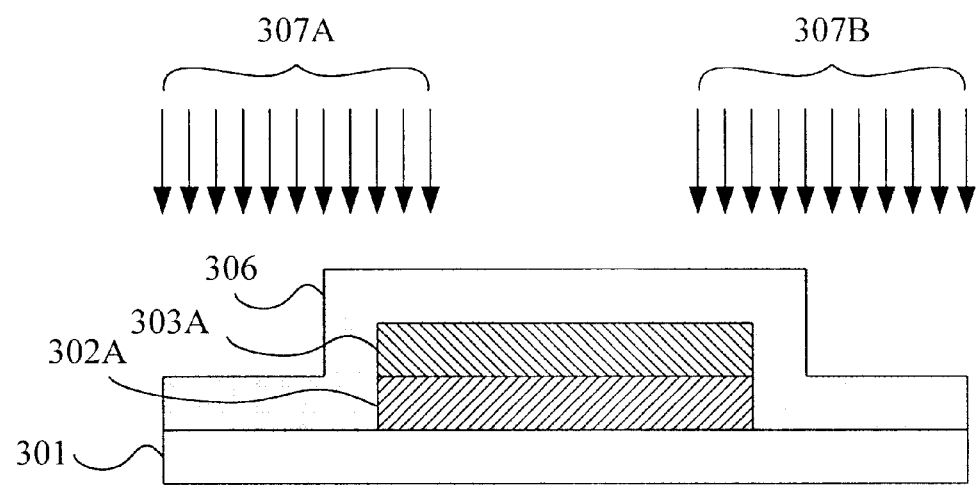
Figure 3F:
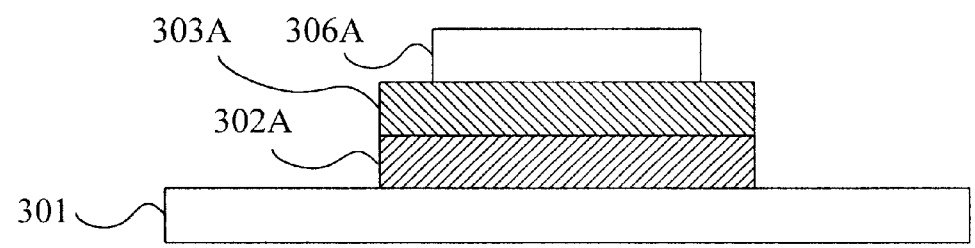
Figure 3G:
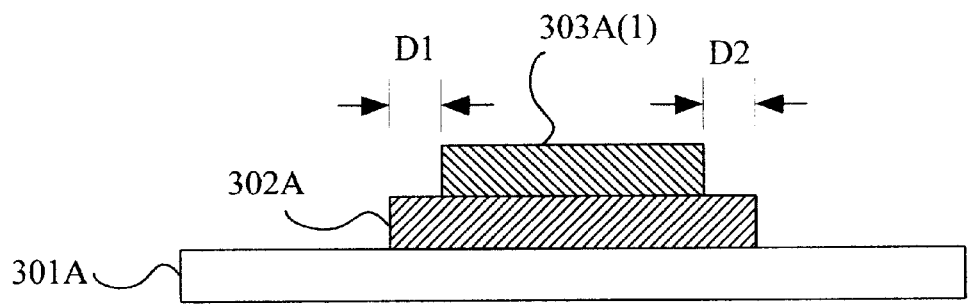

As described above in reference to FIGS. 3A and 3E, the prior art uses two non-aligned patterning steps to determine the final structure, thereby adding complexity and potential error to the process. The present invention significantly simplifies the fabrication process by eliminating the opaque to attenuated edge altogether. Instead, the above-described sub-resolution rim, defined by distance d1 or d2, is provided. Advantageously, distances d1–d5 can be provided by a highly accurate patterning tool, such as the e-beam scanner described in reference to FIG. 4A. Thus, the present invention can determine the alignment for the final structure in a single, accurate patterning step.

Figure 5B:
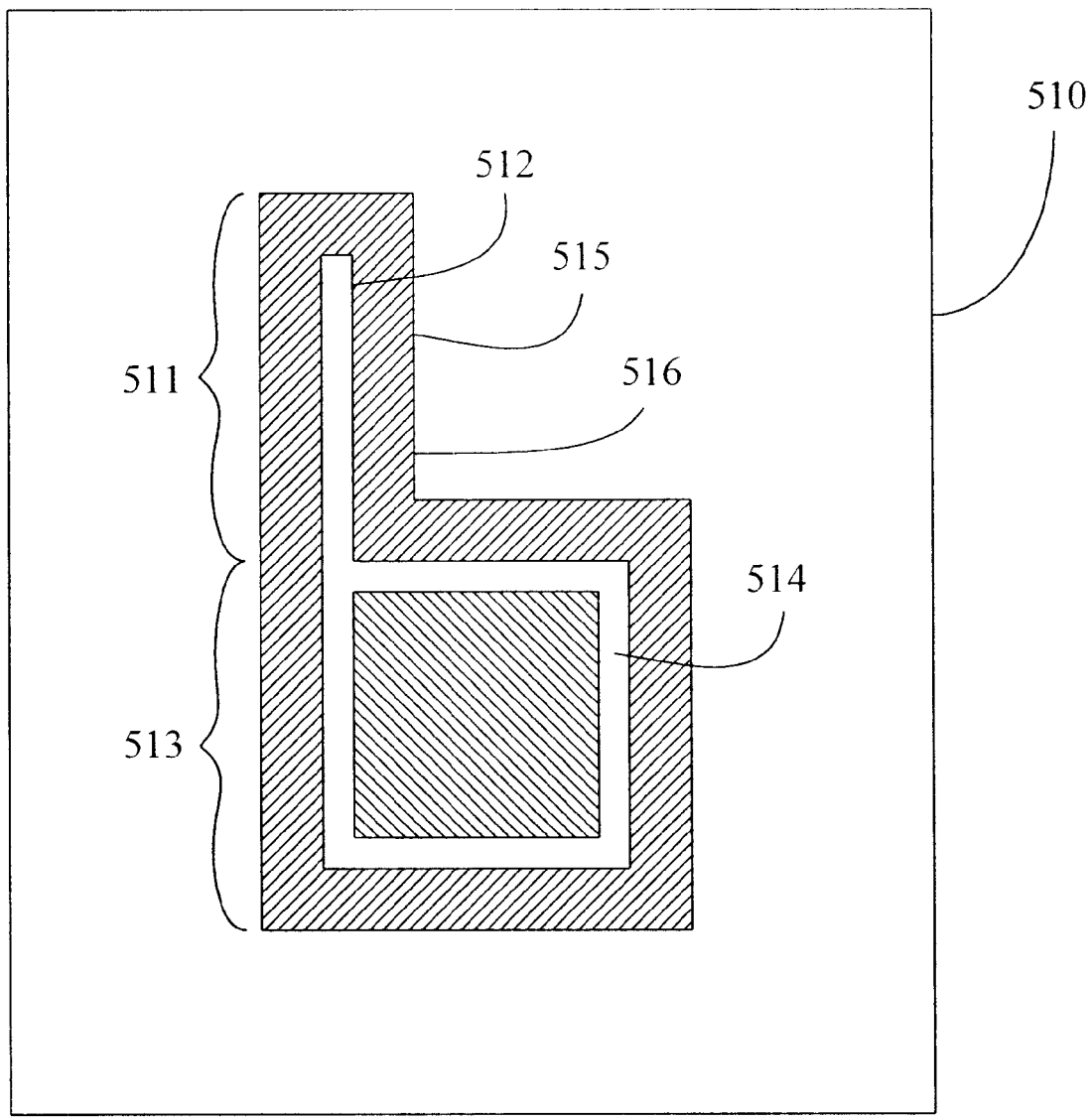
FIG. 5B illustrates a layout in which a smaller attenuated portion includes a sub-resolution line of the present invention, whereas a larger attenuated portion includes a sub-resolution rim of the present invention.

Note that in cases where a thin opaque line would be formed in the prior art, thereby causing significant problems in mask fabrication, the present invention uses a sub-resolution line formed in the same manner as the above-described sub-resolution rim (i.e. formed from a transparent layer having an optical intensity transmission coefficient T=1 ($\geq 90\%$ transmission) and a 0 degree phase). For example, FIG. 5B illustrates a layout 510 in which a smaller attenuated portion 511 includes a sub-resolution line 512, whereas a larger attenuated portion 513 includes a sub-resolution rim 514. Of importance, sub-resolution line 512 is self-aligned in accordance with the present invention, whereas an opaque patch (provided in the prior art) would not be self-aligned. Therefore, from a manufacturing perspective, forming sub-resolution line 512 can be done more accurately and more uniformly compared to an opaque patch.

Note that in accordance with one feature of the present invention, distances d1–d4 can be optimized for each feature type and size. Thus, in some embodiments, distances d1–d4 can vary on the mask. For example, referring to FIG. 5B, assume that portion 511 further includes an assist feature, such as a hammerhead (not shown). In this case, the width of the attenuated region at an edge 515 can be smaller than the width of the attenuated region at an edge 516, thereby decreasing the probability of side-lobe printing at the end of the line. Moreover, in yet other embodiments, d1/d3 and d2/d4 can be optimized for each edge of a feature.

The above-described embodiments are meant to be illustrative of the invention and not limiting. Modifications, alternatives, and variances to these embodiments may be apparent to those skilled in the art. For example, although the above description refers to a 0 degree and 180 degree phase, the present invention is equally applicable to other embodiments in which the transparent and attenuated regions have different phases. In those embodiments, the relative phase between the transparent and attenuated regions is approximately 180 degrees. Thus, the 0 degree phase for the transparent region and the 180 degree phase, although providing one specific embodiment, also indicate the phases for these two regions relative to one another.

Moreover, various exposure wavelengths including, but not limited to, 436 nanometers (nm), 365 nm, 248 nm, 193 nm, 157 nm, and 126 nm, can be used in accordance with the present invention. Note that other exposure wavelengths, including extreme UV (EUV) and X-rays can also be used. The EUV wavelength most commonly used is approximately 13 nm, whereas the X-ray wavelength most commonly used is approximately 1.3 nm. Additionally, the materials used for the opaque layer, the attenuated layer, and the substrate can be changed without departing from the scope of the invention. For example, the optical intensity transmission of the opaque layer could be as high as approximately 10% and the optical intensity transmission of the substrate could be as low as approximately 70%.

Figure 6:
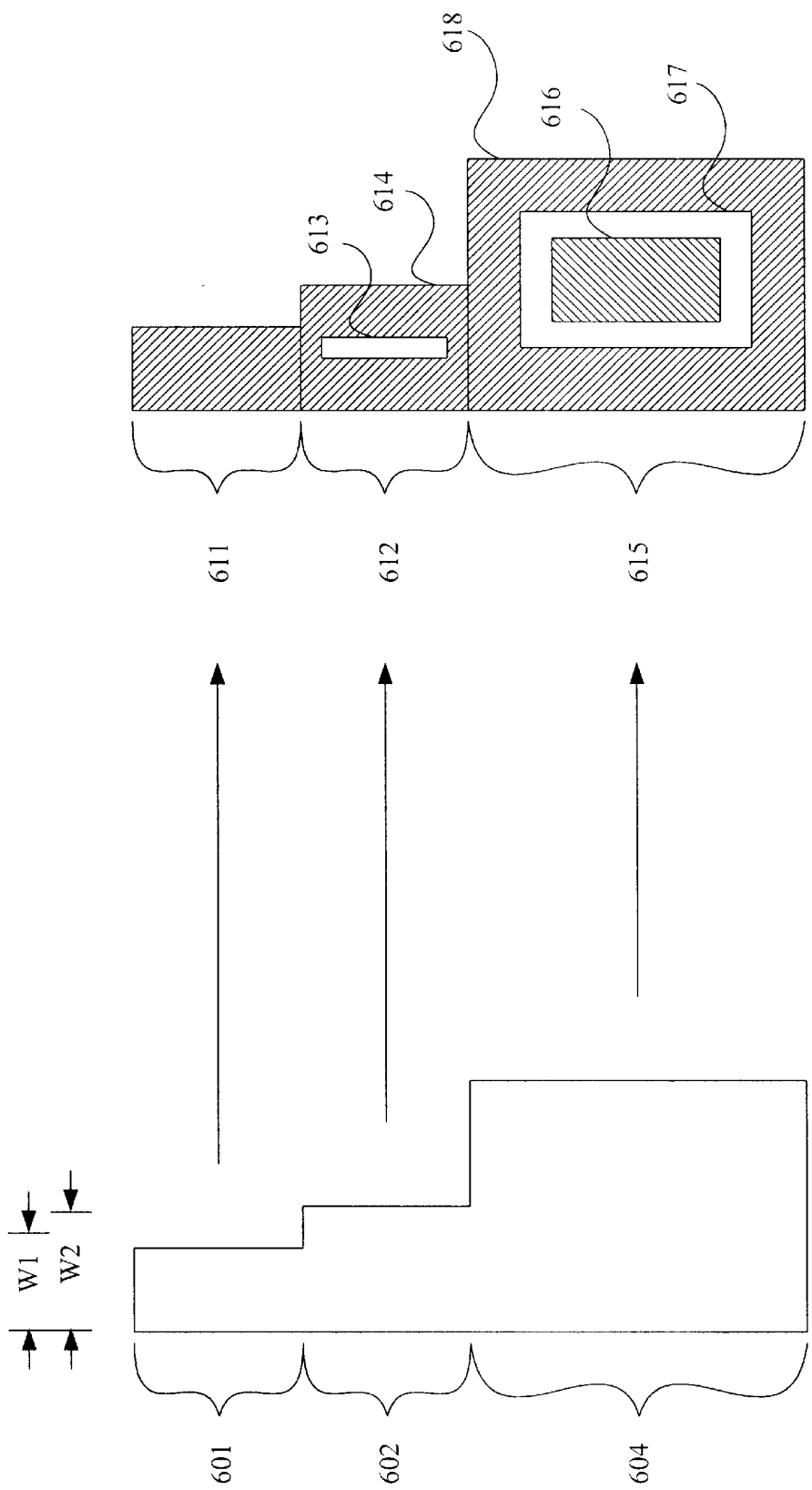
FIG. 6 illustrates a conversion of a standard binary mask layout to a tri-tone, attenuated mask layout using the present invention.

Finally, the present invention of providing a tri-tone, attenuating mask layout can be applied to a standard binary mask layout as shown in FIG. 6. If the width of a polygon 601 in the binary mask layout is smaller than a first width W1, then polygon 601 can be replaced by a structure 611 including only an attenuated portion. On the other hand, if the width of a polygon 602 is between W1 and a second width W2, then polygon 602 can be replaced by a structure 612 including a sub-resolution line 613 formed in the middle of an attenuated portion 614. Finally, if the width of a polygon 604 is larger than W2, then polygon 604 can be replaced by a structure 615 including an opaque portion 616 surrounded by a sub-resolution rim 617, which in turn is surrounded by an attenuated portion 618. This type of conversion can be performed using a standard design rule checker tool, such as the Calibre tool from Mentor Graphics, the Hercules tool from Avanti Technologies Inc., or the Dracula, Vampire, or Assura tools from Cadence Design Systems, Inc.

Accordingly, the present invention is intended to include all such modifications, alternatives, and variances that fall within the scope of the appended claims.

What is claimed is:

1. A lithographic mask comprising:
a plurality of structures,
wherein a subset of the structures include an opaque region, an attenuated region, and a sub-resolution transparent rim between the opaque region and the attenuated region.

2. The mask of claim 1, wherein the plurality of structures are formed on a transparent layer and the transparent rim is formed with the transparent layer.

3. The mask of claim 1, wherein the transparent rim has approximately a 0 degree phase.

4. The mask of claim 1, wherein the attenuated region has approximately a 180 degree phase.

5. The mask of claim 1, wherein the transparent rim has an optical intensity transmission coefficient greater than 0.9.

6. The mask of claim 1, wherein the attenuated region has an optical intensity transmission coefficient between approximately 0.3 and approximately 1.0.

7. The mask of claim 1, wherein the opaque region has an optical intensity transmission coefficient of less than approximately 0.01.

8. The mask of claim 1, wherein at least one of the subset of structures includes an attenuated portion comprising a sub-resolution line without an adjacent opaque region.

9. A method of forming a plurality of structures in an attenuated phase-shifting mask, wherein a subset of the structures are formed by a first region and a second region, wherein the first region has a phase shift relative to the second region of 180 degrees, the method comprising:
providing a third region within a boundary for the second region; and
providing a sub-resolution rim within the boundary of the second region and adjacent a boundary for the third region.

10. The method of claim 9, wherein the first region includes a transparent region.

11. The method of claim 10, wherein the second region includes an attenuated region.

12. The method of claim 11, wherein the third region includes an opaque region.

13. The method of claim 12, further including aligning the opaque region and the sub-resolution rim at the same time.

14. The method of claim 12, further including aligning the opaque region and the sub-resolution rim in a single step.

15. The method of claim 14, wherein aligning the opaque region and the sub-resolution rim is performed by an electron beam scanner.

16. A method of forming a plurality of structures in an attenuated phase-shifting mask, wherein a subset of the structures are formed by a transparent region and an attenuated region, wherein the transparent region has a phase shift relative to the attenuated region of 180 degrees, the method comprising:
providing an opaque region within a boundary for the attenuated region; and
providing a sub-resolution rim within the boundary of the attenuated region and adjacent a boundary for the opaque region.

17. The method of claim 16, wherein the transparent region provides an optical intensity transmission coefficient greater than 0.9.

18. The method of claim 16, wherein the attenuated region provides an optical intensity transmission coefficient between approximately 0.03 and approximately 1.0.

19. The method of claim 16, wherein the opaque region provides an optical intensity transmission coefficient less than 0.1.

20. The method of claim 16, further including aligning the opaque region and the sub-resolution rim at the same time.

21. The method of claim 16, further including aligning the opaque region and the sub-resolution rim in a single step.

22. The method of claim 16, wherein aligning the opaque region and the sub-resolution rim is performed by an electron scanning beam.

23. A method of fabricating an attenuated phase-shifting mask, the method comprising:
providing a transparent layer;
providing an attenuated layer on the transparent layer, wherein a phase shift of the attenuated layer relative to the transparent layer is approximately 180 degrees;
providing an opaque layer on the attenuated layer;
providing a first resist layer on the opaque layer; and
patterning the first resist layer to provide an alignment for an attenuated region, an opaque region, and a sub-resolution rim.

24. The method of claim 23, further including etching the opaque layer to form the opaque region.

25. The method of claim 24, further including etching the attenuated layer to form the attenuated region.

26. The method of claim 25, further including removing the patterned first resist layer and providing a second resist layer that covers the opaque region and exposes the attenuated region.

27. The method of claim 26, further including removing any opaque portion not covered by the second resist layer.

28. The method of claim 27, further including removing the second resist layer.

29. Computer software for forming an attenuated phase-shifting mask from a blank, the blank including a transparent layer, an attenuated layer, and an opaque layer, the attenuated phase-shifting mask including a plurality of structures, a subset of the structures including a transparent region, an attenuated region, an opaque region formed within the attenuated region, a transparent rim formed adjacent the opaque region, the software comprising:

means for aligning the attenuated region, the opaque region, and the transparent rim simultaneously.

30. The software of claim 29, further including means for etching the opaque layer to form the opaque region.

31. The software of claim 30, further including means for etching the attenuated layer to form the attenuated region.

32. The software of claim 31, further including means for protecting the opaque region and exposing the attenuated region.

33. The software of claim 32, further including means for removing any opaque portion exposed by the means for protecting.

34. The software of claim 33, further including means for exposing the opaque region.

35. Computer software to convert an integrated circuit layout into an attenuated phase-shifting mask layout for fabricating the integrated circuit, the software comprising:

means for identifying a subset of structures in the integrated circuit layout; and means for converting the subset of structures into the mask layout, wherein each converted structure includes a transparent region, an attenuated region formed within the transparent region, an opaque region formed within the attenuated region, and a sub-resolution transparent rim formed adjacent the opaque region.

36. The software of claim 35, further including means for aligning the attenuated region, the opaque region, and the sub-resolution transparent rim simultaneously.

37. The software of claim 36, further including means for etching an opaque layer to form the opaque region.

38. The software of claim 37, further including means for etching an attenuated layer to form the attenuated region.

39. The software of claim 38, further including means for protecting the opaque region and exposing the attenuated region.

40. The software of claim 39, further including means for removing any opaque portion exposed by the means for protecting.

41. The software of claim 40, further including means for exposing the opaque region.

42. A method of fabricating an integrated circuit, the method comprising:

radiating a plurality of lithographic masks, at least one mask comprising:

a plurality of structures, wherein a subset of the structures include an opaque region, an attenuated region, and a sub-resolution transparent rim between the opaque region and the attenuated region;

focusing emanating radiation from the at least one mask onto a resist layer provided on a wafer; and developing the resist layer to form the integrated circuit.

43. The method of claim 42, wherein the attenuated region provides a 180 degree phase shift.

44. The method of claim 43, wherein the sub-resolution transparent rim provides a 0 degree phase shift.

45. The method of claim 44, wherein the attenuated region provides an optical intensity transmission of between 30 and 100%.

46. The method of claim 45, wherein the sub-resolution transparent rim provides an optical intensity transmission greater than 90%.

47. A method of converting a binary mask layout into a tri-tone, attenuating mask layout, the method comprising:

dividing up a structure on the binary mask layout into one or more polygons, wherein if the width of a polygon is smaller than a first width W1, then replacing the polygon with a first structure including only an attenuated portion, wherein if the width of the polygon is between the first width W1 and a second width W2, then replacing the polygon with a second structure including a sub-resolution line formed in the middle of an attenuated portion, and wherein if the width of the polygon is larger than the second width W2, then replacing the polygon with a third structure including an opaque portion surrounded by a sub-resolution rim, which in turn is surrounded by an attenuated portion.

48. A mask including a plurality of structures, the plurality of structures representing a layer of an integrated circuit, the mask including:

means for providing a sub-resolution feature associated with at least one structure, the feature having an approximately 0 degree phase shift.

49. The method of claim 48, wherein the sub-resolution feature has an optical intensity transmission greater than approximately 90%.

50. The mask of claim 48, further including means for providing a 180 degree phase region associated with the at least one structure.

51. The mask of claim 50, wherein the 180 degree phase region has an optical intensity transmission of between approximately 30 and 100%.

52. The mask of claim 48, further including means for providing an opaque region associated with the at least one structure, the opaque region having an optical intensity transmission of less than approximately 1%.

* * * * *